United States Patent
Sanjurjo

(10) Patent No.: US 8,545,944 B2
(45) Date of Patent: Oct. 1, 2013

(54) METHOD FOR PRODUCING SOLAR GRADE FILMS FROM SEMICONDUCTOR POWDERS

(75) Inventor: Angel Sanjurjo, San Jose, CA (US)

(73) Assignee: SRI International, Menlo Park, CA (US)

( * ) Notice: Subject to any disclaimer, the term of this patent is extended or adjusted under 35 U.S.C. 154(b) by 356 days.

(21) Appl. No.: 12/435,859

(22) Filed: May 5, 2009

(65) Prior Publication Data

US 2010/0075456 A1 Mar. 25, 2010

Related U.S. Application Data

(60) Provisional application No. 61/098,513, filed on Sep. 19, 2008.

(51) Int. Cl.
*B05D 1/12* (2006.01)
*B05D 3/06* (2006.01)

(52) U.S. Cl.
USPC ........... 427/551; 427/76; 427/190; 427/376.1

(58) Field of Classification Search
USPC ................... 427/551, 76, 190, 376.1
See application file for complete search history.

(56) References Cited

U.S. PATENT DOCUMENTS

| | | | |
|---|---|---|---|
| 4,449,286 A * | 5/1984 | Dahlberg | 438/85 |
| 4,690,797 A | 9/1987 | Eyer et al. | |
| 5,496,416 A * | 3/1996 | Hall et al. | 136/258 |
| 5,800,611 A * | 9/1998 | Christensen | 117/68 |
| 2003/0217828 A1 * | 11/2003 | Opoku-Adusei et al. | 164/98 |
| 2005/0176218 A1 | 8/2005 | Jonczyk | |
| 2005/0221017 A1 * | 10/2005 | Sklyarevich et al. | 427/457 |

OTHER PUBLICATIONS

Supplementary Search Report for PCT/US2009/043447, Nov. 5, 2009.

* cited by examiner

*Primary Examiner* — Frederick Parker

(57) ABSTRACT

The present invention relates generally to production of photoelectric grade films or cells from semiconductor powders or dust. In one embodiment, the present invention provides a method for producing a photoelectric grade film from a semiconductor powder. The method includes providing a substrate, coating the substrate with a layer of the semiconductor powder and moving the substrate with the layer of the semiconductor powder under an energy source at a predefined rate, wherein the predefined rate is sufficient to melt the semiconductor powder by the energy source and to cool the substrate such that substantially all impurities are moved to an edge of the substrate.

13 Claims, 5 Drawing Sheets

METHOD FOR PRODUCING SOLAR GRADE FILMS FROM SEMICONDUCTOR POWDERS

CROSS REFERENCE TO RELATED APPLICATIONS

This application claims the benefit of U.S. Provisional Application No. 61/098,513, filed on Sep. 19, 2008, which is herein incorporated by reference in its entirety.

FIELD OF THE INVENTION

The present invention relates generally to a method and system for producing of solar grade films from semiconductor powders or dust.

BACKGROUND OF THE INVENTION

Currently, there is a drive towards cleaner renewable energy sources as an alternative to traditional fossil fuels. One type of renewable energy source that has a growing demand is solar cells. Solar cells are generally fabricated from high purity silicon. However, currently the cost to fabricate solar cells is relatively high.

One reason is due to a high cost of the starting raw material, e.g., silicon. In addition, the polycrystalline feedstock has to be grown into a single crystal or slowly solidified into an ingot increasing the cost further. Finally, the boules have to be cut into wafers resulting in an over 30% loss as saw dust. Due to the growing demand of solar cells and increased use of silicon in various applications, the cost of silicon has risen. However, other sources of silicon may be found other than directly from silicon suppliers. For example, other sources of silicon may be found in fluid bed reactors, purified saw dust, broken pieces of silicon, metallurgical grade silicon and the like. The present invention provides a solution to utilizing these other sources of silicon.

SUMMARY OF THE INVENTION

In one embodiment, the present invention is directed towards a method for producing a photoelectric grade film from a semiconductor powder. The method comprises providing a substrate, coating said substrate with a layer of said semiconductor powder and moving said substrate with said layer of said semiconductor powder under an energy source at a predefined rate, wherein said predefined rate is sufficient to melt said semiconductor powder by said energy source and to cool said substrate such that substantially all impurities are moved to an edge of said substrate.

In one embodiment, the present invention is directed towards a system for producing a photoelectric grade film from a semiconductor powder. The system comprises a substrate coated with a semiconductor powder, at least one energy source and a moving means for moving said substrate with said layer of said semiconductor powder under said at least one energy source at a predefined rate, wherein said predefined rate is sufficient to melt said powder by said energy source and to cool said substrate such that substantially all impurities are moved to an edge of said substrate.

In one embodiment, the present invention is directed towards a method for producing a photoelectric grade film from a semiconductor powder. The method comprises providing a substrate, coating said substrate with a layer of said semiconductor powder and moving an energy source over said substrate with said layer of said semiconductor powder at a predefined rate, wherein said predefined rate is sufficient to melt said powder by said energy source and to cool said substrate such that substantially all impurities are moved to an edge of said substrate.

BRIEF DESCRIPTION OF THE DRAWINGS

The teaching of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
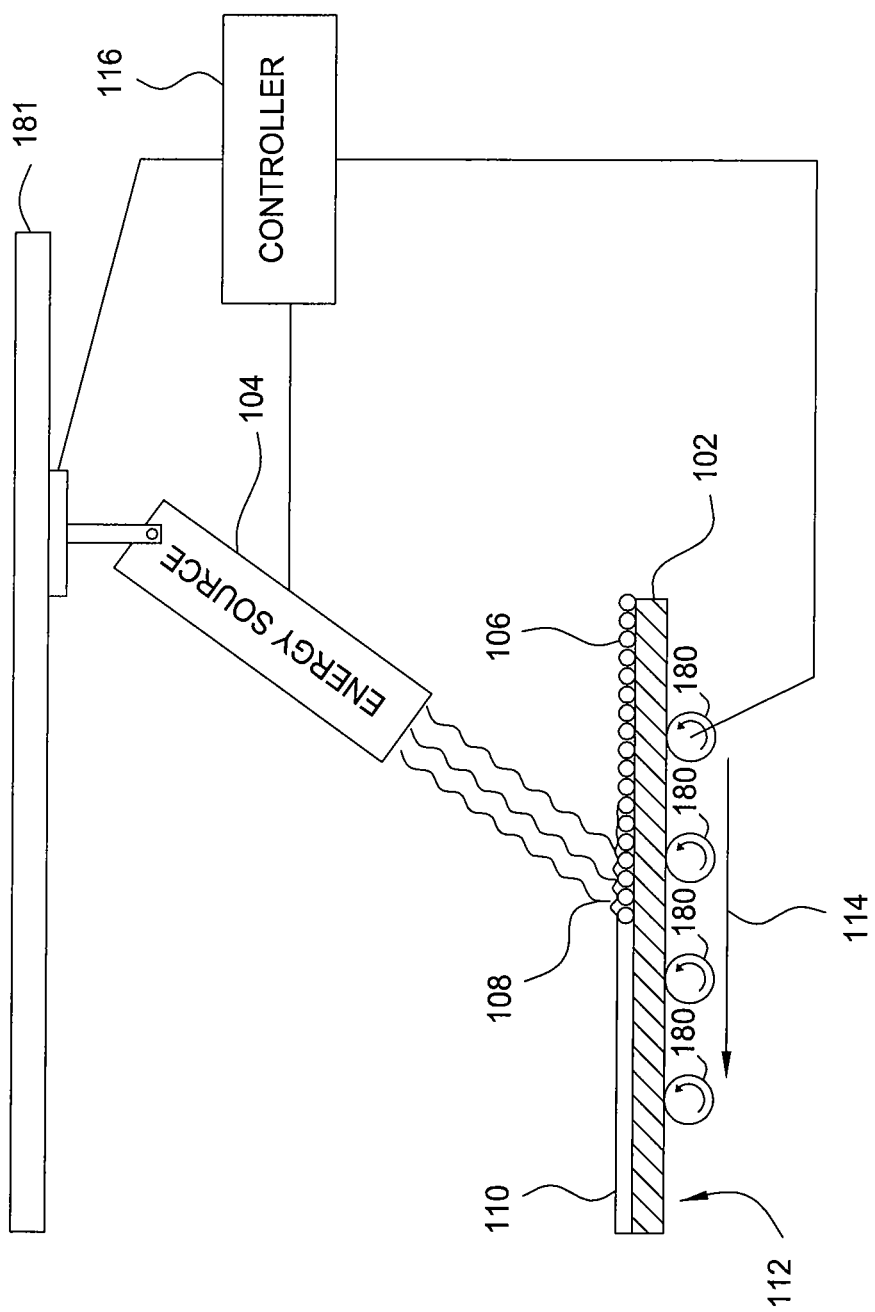
FIG. 1 illustrates a cross sectional view of an exemplary system of the present invention.

In one embodiment, the present invention provides a method and system for producing photoelectric grade films from silicon powders or dust. FIG. 1 illustrates one embodiment of a system 100 for producing photoelectric grade films from semiconductor powders or dust. In one embodiment, the system 100 may be enclosed, for example in a chamber, or be an open system. In one embodiment, the system 100 comprises an energy source 104 and a substrate 102. Notably, the substrate 102 of the present invention does not need to be a fully densified solid. For example, the substrate 102 may be a porous body or even a powder that is loosely compacted. In one embodiment, the substrate may range in size, for example, from about 10 centimeters (cm)×10 cm to 1 meter (m)×1 m.

The substrate 102 may be any material that will not melt readily under the energy source 104. For example, the substrate 102 may be silicon based materials or a graphite or a ceramic such as silicon carbide, mullite or cordierite coated with carbon particles.

In one embodiment, a mechanical means 180, either manual or automated, may be provided for moving the substrate 102 as energy is applied by the energy source 104. For example any mechanical means suitable for moving the substrate 102 including a robot arm, a silicon wafer wand, mechanical rollers, a moveable plate and the like. Alternatively, the substrate 102 may remain still and the energy source 104 may be moved along the substrate 102, e.g., the energy source 104 can be mounted on to a moving means 181, for example a rail or track system.

Although FIG. 1 illustrates that the energy source 104 is above the substrate 102, those skilled in the art will recognize that the energy source 104 may be oriented relative to the substrate 102 in any way. For example, the substrate 102 may be above the energy source 104. The orientation illustrated in FIG. 1 should not be limiting in any way.

The energy source 104 may be any energy source suitable to melt a semiconductor powder or dust 106 that is layered on top of the substrate 102. Hereinafter, semiconductor powder 106 and semiconductor dust 106 may be used interchangeably or simply referred to as powder 106 or dust 106. In addition, substrate 102 may refer to the substrate 102 by itself or a substrate 102 having the powder 106 melted and re-solidified on the substrate 102. For example, in one embodiment, the substrate 102 may be a silicon based substrate and the powder 106 may be a silicon powder.

The system 100 may also include a controller 116. The controller 116 may comprise a processor, a computer readable medium and input/output devices. For example, the computer readable medium may be memory such as hard disk drives, floppy drives, read only memory (ROM), random access memory (RAM), CD-ROM disks and the like. The input/output devices may include a monitor, a keyboard, a mouse, a trackball and the like.

In one embodiment, the controller 116 may be used to control the rate of movement of the moving means 180 and 181. Also the controller 116 may be used to control the heat output of the energy source 104. For example, specific parameters, as described below, may be stored in the computer readable medium and then accessed and executed by the processor in the controller 116.

In one embodiment, when silicon powders are used, to achieve the lowest cost the silicon powder may be a low cost metallurgical grade silicon powder, which may then be purified. In one embodiment, the source of the silicon powder may include powders from fluid bed reactors, purified saw dust or purified metallurgical grade silicon. Purification of the metallurgical grade silicon powder may be achieved by any purification process known in the art. For example, two processes for purification are disclosed in U.S. Pat. No. 4,612,179, issued to Sanjurjo, et al. and U.S. Pat. No. 4,828,814, issued to Sanjurjo, et al., both of which are hereby incorporated by reference.

However, it should be noted that the techniques disclosed in the present invention may be applicable to other types of powders. For example, in one embodiment cadmium telluride (CdTe) powder may be used to produce cadmium telluride films for solar cells or x-ray detectors. In another embodiment, copper indium gallium diselenide ($CuInGaSe_2$) powder, also known as CIGS, may be used to produce copper indium gallium diselenide films for solar cells.

The energy source 104 may provide energy in any type of form, such as for example, heat, radiation, radio frequency, convection, conduction, electromagnetic and the like. The energy source 104 must be able to provide heat in a controlled manner on specific portions of the substrate 102 to generate temperature gradients sufficient to allow any impurities in the powder 106 and the substrate 102 to move to an edge of the substrate 102. In addition, the energy source 104 should be able to heat the powder 106 very quickly without affecting the underlying substrate 102. As a result, a high purity film may be produced by simply removing the edge of the substrate 102 containing substantially all of the impurities.

In one embodiment, an energy source 104 capable of achieving such controlled heating as required by above process is a gyrotron. Gyrotrons are high powered vacuum tubes which emit millimeter wavelength beams by bunching electrons with cyclotron motion in a strong magnetic field. Output frequencies range from about 20 to 250 Gigahertz (GHz), covering wavelengths from microwave to the edge of a terahertz gap. Typical output powers range from tens of kilowatts to 1-2 megawatts.

A gyrotron is able to provide heat in a controlled and defined manner suitable for the present invention. For example, the energy source of the gyrotron may be controlled like a torch or a paintbrush such that specific portions of the substrate 102 may be heated as desired.

As the substrate 102 moves while heat is applied by the energy source 104 or the energy source 104 moves while applying heat to the substrate 102 at a predefined rate, a plurality of regions are developed on the substrate 102. For example, initially before heating, the entire top of the substrate 102 is a single first region of the powder 106. In one embodiment, as the substrate 102 moves from right to left as indicated by arrow 114, a second region of liquid 108 is generated. As the substrate 102 moves further from right to left, the liquid interface 108 cools and re-solidifies to form a third region of the re-solidified plate 110 having a high purity film.

Notably, the liquid region 108 will be transient along the substrate 102 as the substrate 102 moves while heat is applied by the energy source 104 or the energy source 104 moves while applying heat to the substrate 102 and as the substrate 102 is allowed to cool at a predefined rate. Moreover, eventually as all of the powder region 106 is melted into a liquid region 108 and then allowed to re-solidify, the entire substrate 102 will eventually only comprise the re-solidified plate region 110.

The rate of cooling of the liquid region 108 of the substrate 102 is a rate that is sufficient to achieve purification of the substrate 102. Said another way, the predefined rate is sufficient to allow the energy source 104 to melt the powder 106 and to cool the substrate such that substantially all impurities are moved to an edge of the substrate. The rate of cooling will depend on the geometry and size of the substrate 102. One skilled in the art will be able to determine the rate of cooling necessary based on the material, geometry and size of the substrate 102 to achieve purification of the substrate 102.

Figure 2:
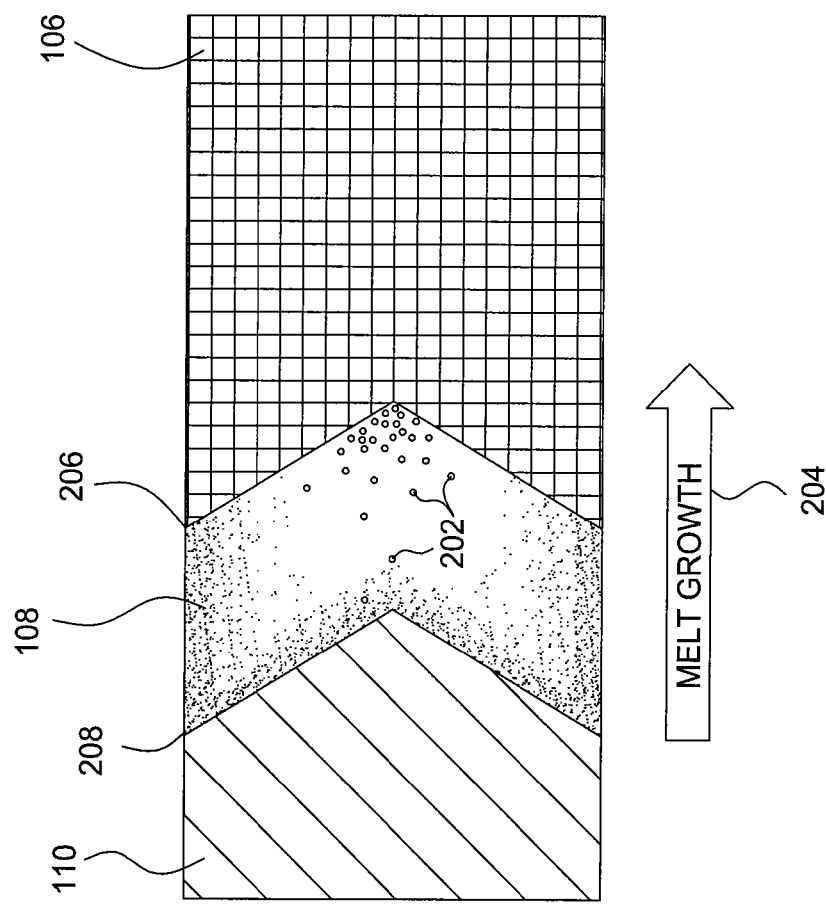
FIG. 2 illustrates one embodiment of a top view of each interface of a substrate during processing and temperature gradients within a liquid region of the substrate.

A top view of the plurality of regions in one instance in time is illustrated in FIG. 2. Arrow 204 illustrates a melt growth as the substrate 102 moves from right to left in one embodiment. The powder region 106 is melted into the liquid region 108, which is then re-solidified as the liquid region 108 cools into the re-solidified plate region 110. Impurities 202 may accumulate in whichever region is last to re-solidify after melting. For example, in the embodiment illustrated in FIG. 2, the Impurities 202 may accumulate towards a center of the liquid region 108 at an interface 206 between the liquid region 108 and the powder region 106. The impurities 202 move with the interface 206 in a direction of the melt growth 204 to eventually accumulate substantially all of the impurities 202 at an edge of the substrate 102. For example, if the substrate 102 moves from right to left, substantially of the impurities 202 will be contained in the far right of the substrate 102. FIG. 2 also illustrates an interface 208 that is created between the liquid region 108 and the re-solidified plate region 110.

As discussed above, to allow the impurities 202 to accumulate at the interface 206, the energy source 104 must heat the substrate 102 such that proper temperature gradients are generated. In addition, the substrate 102 must be moved relative to the energy source 104 or the energy source 104 must be moved relative to the substrate 102 at a predefined rate. For example, the temperature gradients must have a thermal profile that allows slow directional solidification of the liquid region 108.

Figure 3:
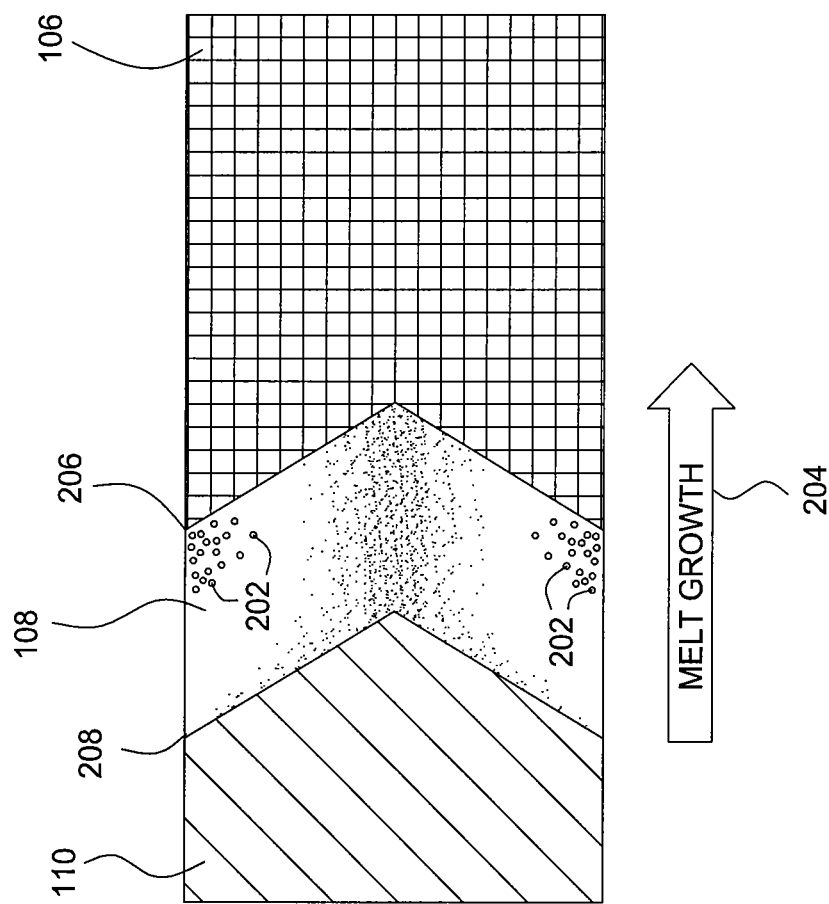
FIG. 3 illustrates one embodiment of a top view of each interface of a substrate during processing and temperature gradients within a liquid region of the substrate.

FIG. 2 illustrates this as a dark region of the liquid region 108 representing a coldest region becomes gradually lighter towards the middle and right of the liquid region 108 representing the hottest region. One skilled in the art will recognize that conversely, the process described herein may be performed such that the coldest region is in the center of the liquid region 108 and gradually becomes warmer towards the edges of the liquid region 108, as illustrated in FIG. 3 and discussed below. Moreover, the direction of the temperature gradient may be towards the right as illustrated in FIG. 2 or towards the left (not shown).

In the embodiment depicted in FIG. 2, the hottest region is in the center of the liquid region 108. As noted above, the impurities 202 congregate towards the center right hottest region of the liquid region 108 because the center right hottest region of the liquid region 108 is last to cool and re-solidify.

Conversely, if the hottest region were on the edges of the substrate 102, the impurities would congregate towards the edges of the substrate 102 rather than in the center. This is illustrated in FIG. 3 as substantially all of the impurities 202 accumulate towards a top right edge and a bottom right edge of the liquid region 108 along interface 206. Thus, the impurities 202 may be controlled to accumulate in any direction as desired based upon the temperature gradients within the liquid region 108.

Moreover as discussed above, the cooling must be slow enough to provide enough time for the impurities 202 to accumulate in a desired location, e.g., at the center of the liquid region 108 and at the interface 206 as illustrated in FIG. 2 or at the top right edge and the bottom right edge as illustrated in FIG. 3. That is, if the liquid region 108 is cooled too quickly and the liquid region 108 re-solidifies too quickly, the impurities 202 may be trapped in the re-solidified plate region 110, which is undesirable. A higher percentage of impurities trapped in the re-solidified plate region 110 will create a less pure film and a substrate having poorer performance characteristics.

As a result, the substrate 102 must be moved relative to the energy source 104 or the energy source 104 must be moved relative to the substrate 102 at a predefined rate for proper heating of the powder region 106 and proper cooling of the liquid region 108 to achieve purification of the substrate 102. In one embodiment, the predefined rate may range approximately from 1 centimeter (cm)/hour (hr) to 1 cm/minute (min).

Consequently, when the entire substrate 102 is heated by the energy source 104 to generate the proper temperature gradient and cooled at a predefined rate sufficient to achieve purification of the substrate 102, substantially all the impurities 202 may be accumulated at an edge of the substrate 102. For example, if the substrate 102 is heated from right to left such that the center of the liquid region 108 is the hottest (e.g., FIG. 2), substantially all of the impurities 202 will accumulate at the center right edge of the substrate 102. Alternatively, if the substrate 102 is heated from right to left such that the center of the liquid region 108 is the coolest (e.g., FIG. 3), then substantially all of the impurities 202 will accumulate at the top right edge and the bottom right edge of the substrate 102. One skilled in the art will recognize that the impurities 202 would simply accumulate on the left edge of the substrate 102 if the substrate 102 was heated from left to right and that the interfaces 206 and 208 would be flipped.

Subsequently, the edge containing substantially all of the impurities 202 may simply be removed, for example by slicing or cutting the edge. As a result, a high purity film remains. Alternatively, if the high purity film is further processed, for example as a solar cell, any needed subsequent metallization steps and or light concentrator schemes may be placed on the edge of the substrate 104 containing substantially all of the impurities 202.

Although the present invention is described using a single energy source 104, those skilled in the art will recognize that the energy source 104 may comprise one or more energy sources 104. For example in one embodiment, a secondary energy source or heater may be used to achieve the slow directional cooling required by the process described herein or for pre-heating the powder 106 before exposing the powder 106 to the energy source 104, as described above. The secondary energy source may heat the substrate at a second rate different from the predefined rate of the energy source 104.

For example the initial energy source 104 may heat and melt the powder 106 very quickly, subsequently followed by a line of conventional heaters arranged to maintain the melted powder 106 in a liquid or molten state in liquid region 108 for a sufficient period of time to allow the impurities 202 to migrate towards the interface 206. That is, the secondary energy source may be used to subsequently "shape" the temperature gradients or a cooling profile of the liquid region 108 as desired. In addition, reflectors may be used to channel the energy source 104 properly to achieve the proper temperature gradients described herein.

Figure 4:
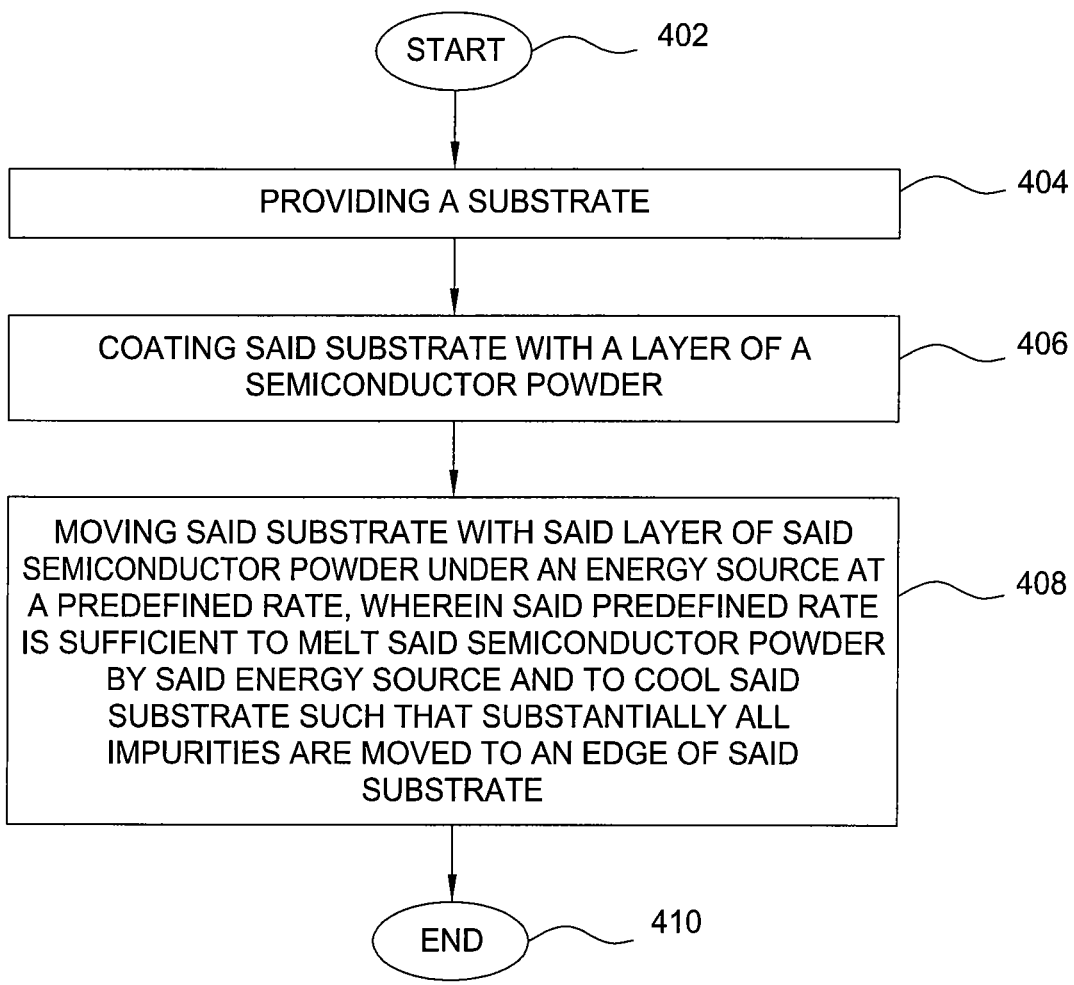
FIG. 4 illustrates an exemplary flow diagram of a method for producing silicon films from silicon powders or dust.

An exemplary method 400 for one embodiment of producing a photoelectric grade film from a semiconductor powder is illustrated in FIG. 4. The method 400 begins at step 402. At step 404 a substrate is provided. As discussed above, the substrate may be any material that will not melt under the energy source 104. For example, the substrate may be a silicon based graphite or ceramic such as silicon carbide, mullite or cordierite coated with carbon particles. Moreover, the substrate of the present invention does not need to be a solid. For example, the substrate may be a porous body or even a powder that is loosely compacted.

At step 406, the substrate may be coated with a layer of semiconductor powder. As discussed above, in one embodiment the semiconductor powder or dust may be a low grade metallurgical silicon powder or dust that is relatively inexpensive. Moreover, the metallurgical silicon powder or dust may be purified before being metered onto the substrate. Any purification process known in the art may be used to purify the metallurgical silicon powder or dust, as described above. One skilled in the art will recognize that the powder or dust may include other types of materials such as cadmium telluride (CdTe) powder or copper indium gallium diselenide (CuInGaSe$_2$) powder depending on the type of film that is to be produced.

At step 408, the method 400 moves the substrate with the layer of the semiconductor powder under an energy source at a predefined rate, wherein the predefined rate is sufficient to melt the semiconductor powder by the energy source and to cool the substrate such that substantially all impurities are moved to an edge of the substrate. The substrate may be moved by any one of the means discussed above. For example, a robot arm, a silicon wafer wand, a mechanical roller or a moveable plate may be used.

As discussed above, the energy source may be any type of energy source. In one embodiment, the energy source is a gyrotron. In addition, one or more energy sources and/or reflectors may be used to shape the temperature gradient or cooling profile of the liquid region on the substrate.

Moreover, as discussed above, the edge that contains substantially all of the impurities depends on the direction the substrate or the energy source is moved and the profile of the temperature gradients of a liquid region on the substrate created by the heat applied by the energy source and the rate of cooling. Various examples are discussed above and illustrated in FIGS. 2 and 3. The method 400 ends at step 410.

Figure 5:
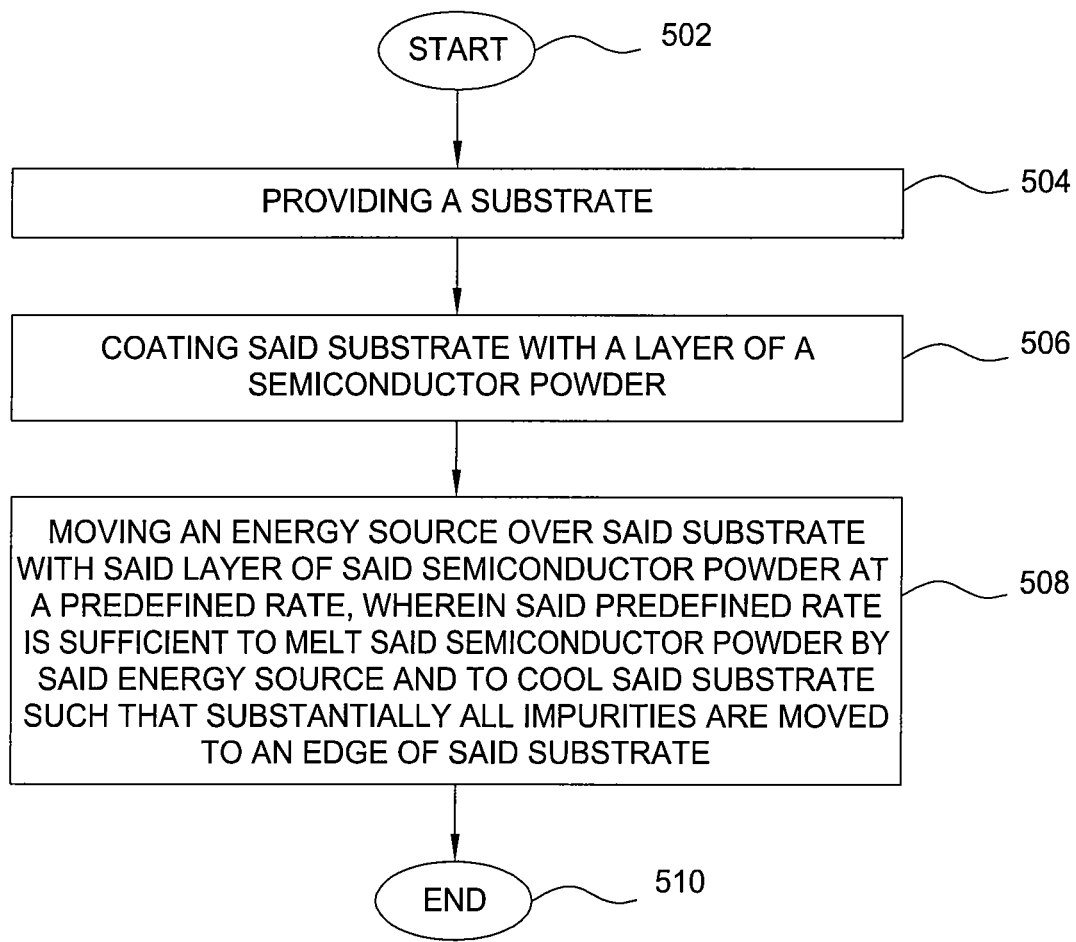
FIG. 5 illustrates a second exemplary flow diagram of a method for producing silicon films from silicon powders or dust.

An alternate exemplary method 500 for one embodiment of producing a photoelectric grade film from a semiconductor powder is illustrated in FIG. 5. The method 500 begins at step 502. At step 504 a substrate is provided. As discussed above, the substrate may be any material that will not melt under the energy source 104. For example, the substrate may be a silicon based graphite or ceramic such as silicon carbide, mullite or cordierite coated with carbon particles. Moreover, the substrate of the present invention does not need to be a solid. For example, the substrate may be a porous body or even a powder that is loosely compacted.

At step 506, the substrate may be coated with a layer of semiconductor powder. As discussed above, in one embodiment the semiconductor powder or dust may be a low grade metallurgical silicon powder or dust that is relatively inexpensive. Moreover, the metallurgical silicon powder or dust may be purified before being metered onto the substrate. Any purification process known in the art may be used to purify the metallurgical silicon powder or dust, as described above. One skilled in the art will recognize that the powder or dust may include other types of materials such as cadmium telluride (CdTe) powder or copper indium gallium diselenide (CuInGaSe$_2$) powder depending on the type of film that is to be produced.

At step 508, the method 500 moves an energy source over the substrate with the layer of the semiconductor powder at a predefined rate, wherein the predefined rate is sufficient to melt the semiconductor powder by the energy source and to cool the substrate such that substantially all impurities are moved to an edge of the substrate. The energy source may be moved by a track system or a rail system.

As discussed above, the energy source may be any type of energy source. In one embodiment, the energy source is a gyrotron. In addition, one or more energy sources and/or reflectors may be used to shape the temperature gradient or cooling profile of the liquid region on the substrate.

Moreover, as discussed above, the edge that contains substantially all of the impurities depends on the direction the substrate or the energy source is moved and the profile of the temperature gradients of a liquid region on the substrate created by the heat applied by the energy source and the rate of cooling. Various examples are discussed above and illustrated in FIGS. 2 and 3. The method 500 ends at step 510.

As a result of method 400 or 500, a high purity film may be created having an edge containing substantially all of the impurities at a relatively low cost. The result is a high purity silicon film that may be used for solar cells at a very low cost. For example, the cost for thin films produced is approximately less than $1 per watt peak and under 10 cents per kilowatt hour (kWh).

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for producing a photoelectric grade film from a semiconductor powder, comprising:
   providing a substrate, wherein the substrate comprises a loosely compacted powder;
   coating said substrate with a layer of said semiconductor powder; and
   moving said substrate with said layer of said semiconductor powder under an energy source at a predefined rate, wherein said predefined rate is sufficient to melt said semiconductor powder by said energy source and to cool said substrate such that substantially all impurities are moved to an edge of said substrate.

2. The method of claim 1, wherein said substrate comprises a silicon based material.

3. The method of claim 1, wherein said semiconductor powder comprises at least one of: silicon (Si), cadmium telluride (CdTe) or copper indium gallium diselenide (CuInGaSe2).

4. The method of claim 1, wherein energy source provides energy in a form of at least one of: heat, radiation, radio frequency, convection, conduction or electromagnetic.

5. The method of claim 1, wherein said energy source comprises a gyrotron.

6. The method of claim 1, wherein said predefined rate comprises a range of approximately 1 centimeter (cm)/hour (hr) to 1 cm/minute (min).

7. The method of claim 1, further comprising:
   removing said edge of said substrate containing substantially all of said impurities.

8. The method of claim 1, further comprising:
   moving said substrate under a second energy source for heating said substrate at a second rate different from said predefined rate.

9. A method for producing a photoelectric grade film from a semiconductor powder, comprising:
   providing a substrate, wherein the substrate comprises a loosely compacted powder;
   coating said substrate with a layer of said semiconductor powder; and
   moving an energy source over said substrate with said layer of said semiconductor powder at a predefined rate, wherein said predefined rate is sufficient to melt said semiconductor powder by said energy source and to cool said substrate such that substantially all impurities are moved to an edge of said substrate.

10. The method of claim 9, wherein said energy source is moved via at least one of: a rail system or a track system.

11. The method of claim 9, wherein said semiconductor powder comprises at least one of: silicon (Si), cadmium telluride (CdTe) or copper indium gallium diselenide (CuInGaSe2).

12. The method of claim 9, wherein said energy source comprises a gyrotron.

13. The method of claim 9, wherein said predefined rate comprises a range of approximately 1 centimeter (cm)/hour (hr) to 1 cm/minute (min).

* * * * *